US006589886B2

(12) United States Patent
Kim et al.

(10) Patent No.: US 6,589,886 B2
(45) Date of Patent: Jul. 8, 2003

(54) METHOD FOR MANUFACTURING ALUMINUM OXIDE FILM FOR USE IN A SEMICONDUCTOR DEVICE

(75) Inventors: Min-Soo Kim, Ichon-shi (KR); Kyong-Min Kim, Ichon-shi (KR); Chan Lim, Ichon-shi (KR); Heung-Sik Kwak, Ichon-shi (KR); Chung-Tae Kim, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/739,444

(22) Filed: Dec. 19, 2000

(65) Prior Publication Data

US 2001/0006835 A1 Jul. 5, 2001

(30) Foreign Application Priority Data

Dec. 22, 1999 (KR) .............................. 99-60563

(51) Int. Cl.⁷ ..................... H01L 21/31; H01L 21/469
(52) U.S. Cl. .................. 438/758; 257/310; 427/126.3
(58) Field of Search ......................... 438/3, 250, 253, 438/254, 758; 204/457; 427/126.3, 456

(56) References Cited

U.S. PATENT DOCUMENTS

| | | | | | |
|---|---|---|---|---|---|
| 6,144,060 | A | * | 11/2000 | Park et al. | 257/298 |
| 6,255,122 | B1 | * | 7/2001 | Duncombe et al. | 438/3 |
| 6,305,314 | B1 | * | 10/2001 | Sneh et al. | 118/723 E |
| 2001/0024387 | A1 | * | 9/2001 | Raaijmakers et al. | 365/200 |
| 2002/0000598 | A1 | * | 1/2002 | Kang et al. | 257/301 |
| 2002/0020868 | A1 | * | 2/2002 | Yang et al. | 257/303 |

* cited by examiner

*Primary Examiner*—William David Coleman
(74) *Attorney, Agent, or Firm*—Jacobson Holman PLLC

(57) ABSTRACT

A method for manufacturing an aluminum oxide film for use in a semiconductor device which includes the following steps: preparing a semiconductor substrate and setting the semiconductor substrate in a reaction chamber; supplying modified trimethyl aluminum (MTMA) as an aluminum source material into the reaction chamber so that it could be absorbed on the semiconductor substrate; discharging unreacted MTMA or by-product through a first pump by permitting nitrogen gas to flow into the reaction chamber and purging the chamber for vacuum status; supplying an oxygen source into the reaction chamber so that it could be absorbed on the semiconductor substrate; and discharging an unreacted oxygen source or by-product through a second pump by permitting nitrogen gas to flow into the reaction chamber and purging the chamber for vacuum status.

16 Claims, 4 Drawing Sheets

METHOD FOR MANUFACTURING ALUMINUM OXIDE FILM FOR USE IN A SEMICONDUCTOR DEVICE

FIELD OF THE INVENTION

The present invention relates to a method for manufacturing a semiconductor device; and, more particularly, to a method for manufacturing an aluminum oxide in the semiconductor device by using a modified trimethyl aluminum (MTMA) as aluminum source material.

DESCRIPTION OF THE PRIOR ART

As is well known, a semiconductor memory device has a higher degree of integration because of downsizing through micronization. However, there is still a demand for downsizing the area of the memory cell, under increased transistor and circuit speeds and improved reliability. Demands for increased density, performance and reliability require the formation of device features with high precision and miniaturization. To meet the demands, it is necessary to increase the capacitance of a capacitor and improve the gate dielectric film which is applied to the DRAM and logic devices. In an attempt to solve a requirement, various researches have been made to employ the high dielectric materials for a capacitor thin film and a gate dielectric film.

Aluminum oxide ($Al_2O_3$) is typically used among high dielectric materials for the capacitor thin film and the gate dielectric thin film because aluminum oxide has good oxidation resistance and thermal stability. Furthermore, it can be used as a hydrogen barrier to prevent hydrogen diffusion.

Aluminum oxide can be formed by using a method such as an atomic layer deposition (ALD). The manufacturing steps are as follows: setting a wafer in a chamber; heating up the wafer to 200° C. to 450° C.; supplying aluminum source material into the chamber; permitting nitrogen gas ($N_2$) to flow into the chamber and purging the chamber for vacuum status in order to sweep off unreacted aluminum source material or by-product; supplying an oxygen source material into the chamber; and permitting nitrogen gas to flow into the chamber and purging the chamber again for vacuum status in order to sweep off unreacted oxygen source material or by-product. The intended thickness of the aluminum oxide film is obtained by repeating the steps listed above.

In a conventional method for manufacturing the aluminum oxide film in the semiconductor device, trimethyl aluminum (TMA) and water ($H_2O$) are mainly employed as the aluminum source material and the oxygen source material, respectively. TMA has a high vapor pressure and the difference between the boiling and melting points are very small. Therefore, it has drawbacks of strong explosiveness and inflammability when it is exposed in the atmosphere. Thus, TMA is not appropriate as the aluminum source material for manufacturing the aluminum oxide film for various uses in the semiconductor device.

SUMMARY OF THE INVENTION

It is, therefore, an object of the present invention to provide a method for manufacturing an aluminum oxide film by using modified trimethyl aluminum (MTMA) as an aluminum source material because it is stable in the atmosphere.

In accordance with one aspect of the present invention, a method for manufacturing an aluminum oxide film for use in a semiconductor device is provided. The method comprises the following steps: a) preparing a semiconductor substrate and setting the semiconductor substrate in a reaction chamber; b) supplying modified trimethyl aluminum (MTMA) as an aluminum source into the reaction chamber so that it can be absorbed on the semiconductor substrate; c) discharging unreacted MTMA or by-product through a first discharge pump by flowing nitrogen gas into the reaction chamber and purging the chamber for vacuum status; d) supplying an oxygen source into the reaction chamber so that it can be absorbed on the semiconductor substrate; and e) discharging the unreacted oxygen source or by-product through a second discharge pump by permitting nitrogen gas to flow into the reaction chamber and purging the chamber for vacuum status.

In accordance with another aspect of the present invention, a method for manufacturing a semiconductor device is provided. The method comprises the following steps of: a) preparing an active matrix with isolation regions, a substrate, gate line, gate oxide and a first insulating layer; b) forming a buffer layer and a first conductive layer on the active matrix; c) forming a dielectric layer of aluminum oxide ($Al_2O_3$) on the first conductive layer by using an ALD method, MTMA being used as aluminum source; d) material obtaining a capacitor structure by forming a second conductive layer on the dielectric layer and patterning the second conductive layer, the dielectric layer, the first conductive layer and the buffer layer; e) forming a hydrogen barrier layer on the capacitor structure; f) forming a bit line and a local interconnection after depositing a second insulating layer; and g) forming a passivation layer on the bit line, the local interconnection and second insulating layers.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE PREFERRED EMBODIMENTS

Figure 1A:
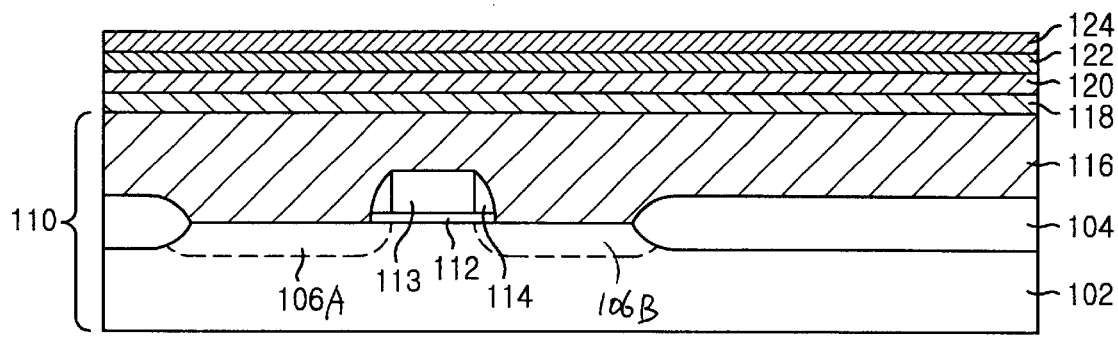
FIGS. 1A to 1E are cross sectional views setting forth a method for manufacturing a semiconductor device incorporating aluminum oxide film in accordance with the preferred embodiment of the present invention.

Referring to FIGS. 1A to 1E, there are cross sectional views provided setting forth a method for manufacturing a semiconductor device incorporating therein an aluminum oxide in accordance with a preferred embodiment of the present invention.

The process for manufacturing the semiconductor device begins with the preparation of an active matrix 110 including the following semiconductor substrate 102, an isolation region 104, diffusion regions 106A and 106B, a gate oxide 112, a gate line 113, a spacer 114 and a first insulating layer 116. One of the diffusion regions 106 serves as a source and the other diffusion region 106 serves as a drain.

Thereafter in FIG. 1A, a buffer layer 118, a first conductive layer 120, a dielectric layer 122 and a second conductive layer 124 are formed on top of the active matrix 118. The dielectric layer 122 in the preferred embodiment is made of aluminum oxide ($Al_2O_3$) with a thickness ranging from 30 Å to 100 Å which is obtained by using a method such as an ALD, wherein the deposition pressure is approximately 50 to 300 mTorr. The buffer layer 118 is formed to improve adhesion between the first insulating layer 116 and the first conductive layer 120.

The method for depositing the aluminum oxide of the dielectric layer 122 is illustrated in more detail below.

Figure 2:
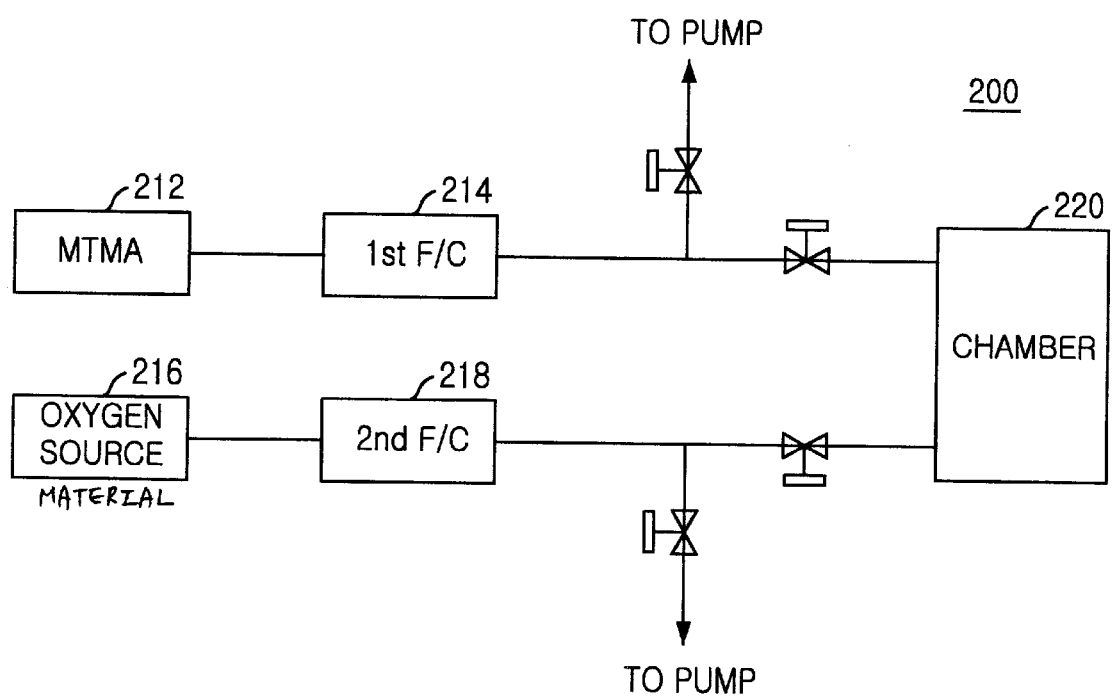
FIG. 2 is an apparatus for depositing an aluminum oxide film by an atomic layer deposition (ALD) technique.

In FIG. 2, a schematic diagram is shown setting forth an apparatus 200 for depositing aluminum oxide by an ALD method. Initially, the wafer is heated up to 200° C. to 450° C. and then aluminum source material, such as modified trimethyl aluminum (MTMA) 212, is supplied into the chamber 220 so that it could be absorbed on the wafer through a first flow controller (F/C) 214. Then the unreacted MTMA or by-product is discharged through a pump by permitting nitrogen gas to flow into the chamber 220 and the chamber is purged for a vacuum status. In the next step, the oxygen source material 216, such as $H_2O$, $O_2$, $N_2O$ or $O_3$, is supplied into the chamber 220 so that it could be absorbed on the wafer through a second flow controller (F/C) 218. Then the unreacted oxygen source material or by-product is discharged through another pump. Each step is carried out for 0.1~3 seconds.

By repeating the steps listed above, it is possible to obtain the intended thickness of the aluminum oxide film. In addition, in order to use MTMA as the aluminum source material, it is required to equip a jacket heater for keeping the temperature of the MTMA vessel up to 50° C. to 100° C., and a line heater for keeping the temperature of a supply-line up to 70° C. to 180° C. It is important that the temperature of the chamber should be kept 200° C. to 450° C., and the pressure should be kept 50 mTorr to 300 mTorr so that the aluminum oxide can be effectively deposited on the wafer.

After depositing the aluminum oxide, an oxygen treatment, such as plasma $N_2O$ or ultra violet ozone (UV/$O_3$), is carried out for removing carbon particles produced from the reaction. Then the annealing process is performed to densify the aluminum oxide film.

Figure 1B:
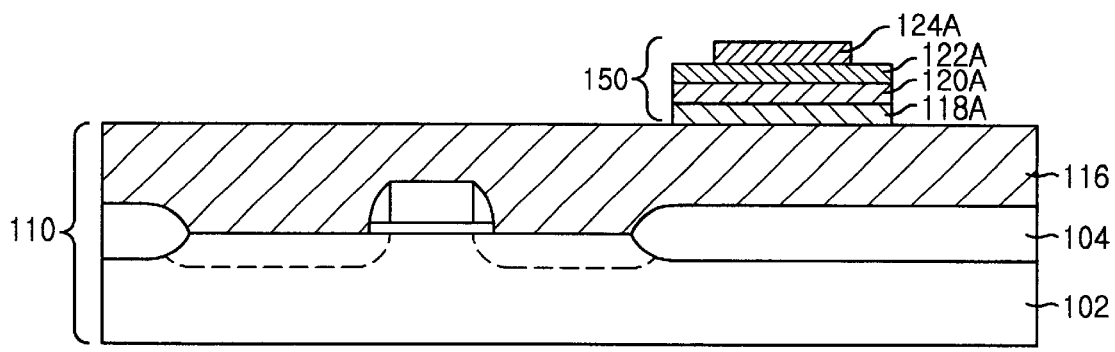

Referring back to FIG. 1A, after layers 118, 120, 122, 124 are formed on the first insulating layer 116, the second conductive layer 124 is patterned into a first predetermined configuration to form a top electrode 124A. Then the dielectric layer 122, the first metal layer 120 and the buffer layer 118 are patterned into a second predetermined configuration, thereby forming a capacitor structure 150 having a buffer 118A, a bottom electrode 120A, a capacitor thin film 122A and a top electrode 124A, as shown in FIG. 1B. The bottom electrode 120A has a different size from the top electrode 124A so that a plate line could form (not shown) during the following processes.

Figure 1C:
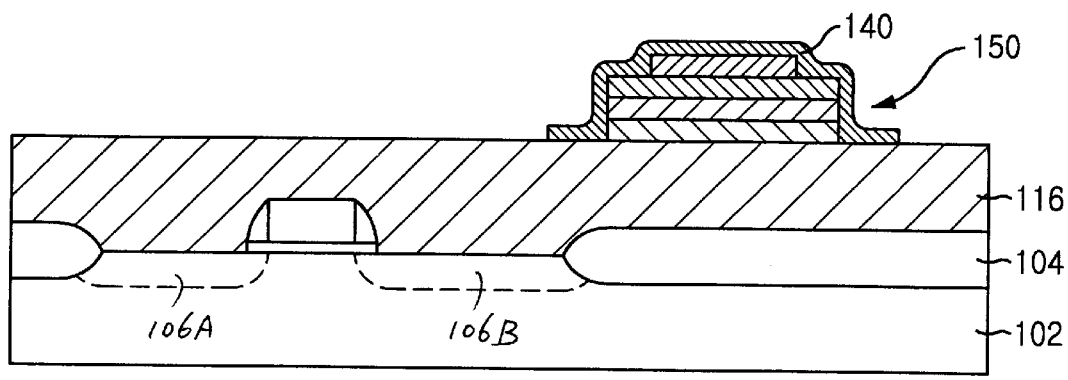

In the next step as shown in FIG. 1C, a hydrogen barrier layer 140 of an aluminum oxide is formed on the capacitor structure 150 and portions of the first insulating layer 116 with a thickness ranging preferably from 60 to 200 Å, for preventing the capacitor structure 150 from experiencing hydrogen penetration during a post manufacturing process, such as a passivation process. Since, the method of forming the aluminum oxide layer by the ALD technique is same as that of the capacitor thin film 122A, the detailed description is abbreviated here.

Figure 1D:
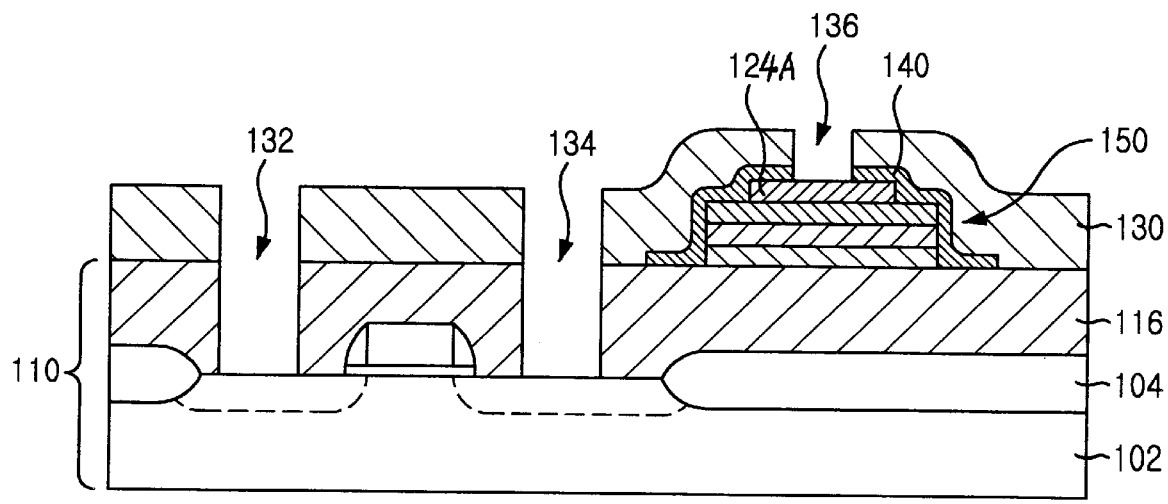
Figure 1E:
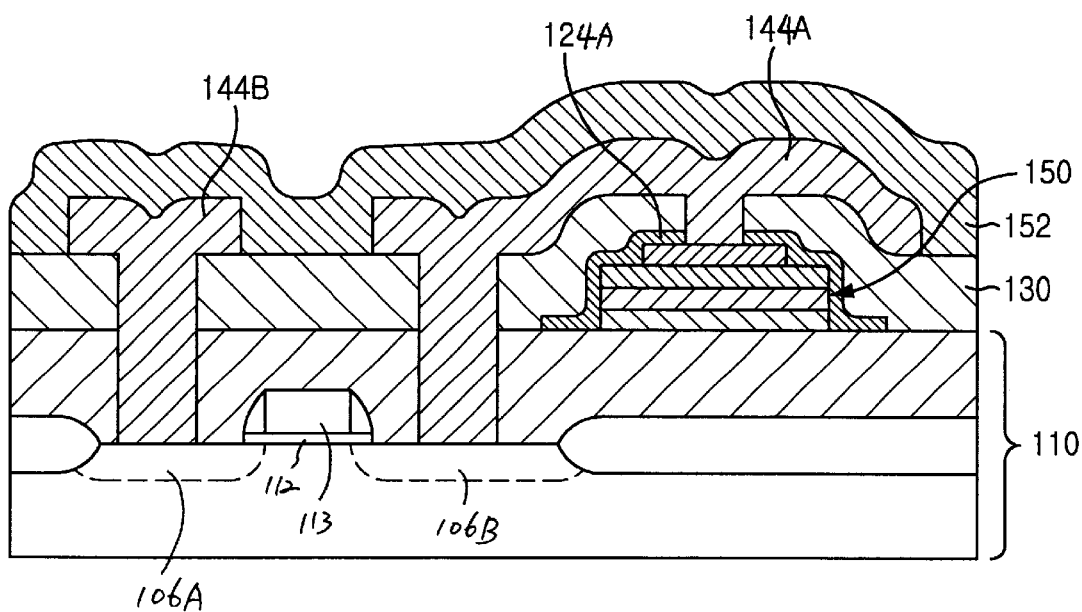

A second insulating layer 130 is formed on the capacitor structure 150 and the first insulating layer 116. Then the resulting structure is patterned into a third predetermined configuration, thereby obtaining openings 132, 134, 136 as shown in FIG. 1D. In a subsequent step, a third conductive layer is formed on the entire surface including the interiors of the openings 132, 134, 136 and patterned so that a bit line 144B and a local interconnection 144A are obtained. A passivation layer 152 is then formed on the entire surface by using a CVD or PVD method as shown in FIG. 1E.

In the embodiment of the present invention, the gate oxide film 112 can be made of aluminum oxide by using the MTMA as the aluminum source material.

Additionally, the aluminum oxide that is formed can be applied to an oxide or a polysilicon etch stop, but it is not limited to that.

In comparison with the prior art which uses trimethyl aluminum (TMA) as the aluminum source material, the present invention provides a more stabilized fabrication method and a decrease in cost, as represented in table 1.

TABLE 2

|  | TMA | MTMA |
| --- | --- | --- |
| Phase | Liquid | Liquid |
| Boiling point | 20° C./vacuum | 50° C./vacuum |
| Melting point | 15.4 | 30 |
| Vapor pressure | 100 Torr (at 100° C.) | 4 Torr (at 100° C.) |
| Molecular weight | 72 | 157 |
| Safety | inflammability/explosiveness (at ATM) | stable (at ATM) |
| Cost | expensive | cheap |

Additionally the MTMA is not affected by a temperature change since a difference between the boiling point and the melting point of the MTMA is larger than that of the TMA and, the vapor pressure of the MTMA is lower than that of the TMA so that the manufacturing process is controlled easier than the prior art of the TMA being used as the aluminum source material. Although the MTMA is exposed on the atmosphere, it is still more stable than the TMA.

The aluminum oxide can be formed through a stabilized manufacturing process if MTMA is used as the aluminum source in accordance with the present invention.

Although the preferred embodiments of the invention have been disclosed for illustrative purposes, those skilled in the art will appreciate that various modifications, additions and substitutions are possible, without departing from the scope and spirit of the invention as disclosed in the accompanying claim.

What is claimed is:

1. A method for manufacturing an aluminum oxide film for use in a semiconductor device, comprising the steps of:
   (a) preparing a semiconductor substrate;
   (b) setting the semiconductor substrate in a reaction chamber;
   (c) supplying modified trimethyl aluminum (MTMA) as an aluminum source into the reaction chamber so that it can be absorbed on the semiconductor substrate;
   (d) discharging unreacted MTMA or by-product through a first discharge pump by permitting nitrogen gas to flow into the reaction chamber and purging the chamber for vacuum status;
   (e) supplying an oxygen source into the reaction chamber for being absorbed on the semiconductor substrate;
   (f) discharging unreacted oxygen source or by-product through a second discharge pump by permitting nitrogen gas to flow into the reaction chamber; and
   (g) purging the chamber for vacuum status.

2. The method of claim 1, wherein the steps (c) to (f) are repeated by using an atomic layer deposition (ALD) method until the aluminum oxide is formed on the semiconductor substrate to a predetermined thickness.

3. The method of claim 1, wherein a temperature of the semiconductor substrate is in the range of 200° C. to 450° C.

4. The method of claim 1, wherein the step (c), is carried out for 0.1 to 3 seconds.

5. The method of claim 1, wherein the temperature of a vessel for storing the MTMA is kept in the range of 50° C. to 100° C.

6. The method of claim 5, wherein the temperature of a supply-line from the MTMA source vessel to the reaction chamber is kept in the range of 70° C. to 180° C.

7. The method of claim 1, wherein the oxygen source is selected from the group consisting of $H_2O$, $O_2$, $N_2O$, and $O_3$.

8. The method of claim 7, wherein the step (e), is carried out for 0.1 to 3 seconds.

9. The method of claim 1, wherein the aluminum oxide is deposited on condition that the temperature of the reaction chamber ranges from 200° C. to 450° C. and the pressure is approximately 300 mTorr.

10. A method for manufacturing a semiconductor device, comprising the steps of:

(a) preparing an active matrix provided with a substrate, isolation regions, gate line, gate oxide and a first insulating layer;

(b) forming a buffer layer and a first conductive layer on the active matrix;

(c) forming a dielectric layer of aluminum oxide ($Al_2O_3$) on the first conductive layer by using an ALD method, MTMA being used as aluminum source material;

(d) forming a second conductive layer on the dielectric layer and patterning the second conductive layer, the dielectric layer, the first conductive layer and the buffer layer, thereby obtaining a capacitor structure;

(e) forming a hydrogen barrier layer on the capacitor structure;

(f) forming a bit line and a local interconnection after depositing a second insulating layer; and (g) forming a passivation layer on the bit line, the local interconnection and the second insulating layer.

11. The method of claim 10, wherein the gate oxide is made of aluminum oxide processed by an ALD method and MTMA is used as aluminum source material.

12. The method of claim 10, wherein the hydrogen barrier layer is made of aluminum oxide processed by an ALD method and MTMA is used as aluminum source material.

13. The method of claim 10, wherein after the step (c), there is a step of annealing the dielectric layer for densification.

14. The method of claim 13, wherein the step of annealing the dielectric layer is carried out at a temperature ranging from 750° C. to 850° C.

15. The method of claim 11, wherein an $N_2$ purging time for forming the aluminum oxide as the gate oxide is approximately 5 to 10 seconds.

16. The method of claim 13, wherein the aluminum oxide as the hydrogen barrier layer is formed to a thickness ranging from 60 Å to 200 Å.

* * * * *